Sept. 1, 1970 E. A. JANNING, JR 3,526,781

PARAMETRIC AMPLIFIER

Filed Nov. 17, 1967

INVENTOR

EUGENE A. JANNING, Jr.

BY Hurwitz, Rose & Greene

ATTORNEYS

United States Patent Office 3,526,781
Patented Sept. 1, 1970

3,526,781

PARAMETRIC AMPLIFIER

Eugene A. Janning, Jr., West Chester, Ohio, assignor to Avco Corporation, Cincinnati, Ohio, a corporation of Delaware Filed Nov. 17, 1967, Ser. No. 683,914
Int. Cl. H03f 7/04
U.S. Cl. 307—88.3 5 Claims

ABSTRACT OF THE DISCLOSURE

A balanced parametric amplifier having simultaneous gain reduction and enhancement of large-signal handling capability, wherein R.F. input signal is applied to and I.F. output signal is derived from the junction of two series connected similarly poled varactors, which are jointly subjected to reverse bias voltage to reduce capacitance versus voltage sensitivity of the varactors, and wherein a pump signal tank circuit comprising two further tuning varactors connected in opposition is coupled in shunt to the first mentioned varactors, pump input signal being applied in push pull to the opposed tuning varactors and pump tuning voltage being applied to their junction.

Background of the invention

It is known to provide parametric amplifiers as R.F. to I.F. frequency converters, with gain control to provide constant output signal level. Pertinent references are U.S. patents to Pan 3,197,708, issued July 27, 1965 and to Murakami 3,195,062, issued July 13, 1965. The configuration of these amplifiers is single ended.

Amplifiers which employ non-linear reactance devices or varactors to effect signal amplification are called parametric amplifiers. These normally include one or more varactors or non-linear reactances to which an input signal is applied, a source of pump signal and an idler circuit for abstracting heterodyne frequency signals which develop on interaction of the pump signal and the input signal in the one or more varactors. The idler signal and the pump signal interact in the varactors to regenerate the R.F. input signal, in such phase as to add energy to the latter.

Parametric amplifiers are essentially small signal amplifiers and large signals tend to drive said amplifiers into a non-linear operating region, with consequent production of distortion. To reduce the gain of the amplifier on application of strong input signals, reverse D.C. bias may be applied to the varactors, assuming that these are capacitor diodes. The reverse bias signal may be an AGC voltage. This has the effect of enhancing large signal handling characteristics, since the varactors then operate in more linear regions of their operating characteristics and effects of second as well as higher order non-linearities are reduced.

The present invention concerns itself with parametric amplifiers employing balanced instead of single ended circuitry, with provision for voltage responsive tuning of a pump drive circuit by means of varactors coupled in push pull relation to the mixer varactors.

SUMMARY OF THE INVENTION

A balanced parametric amplifier wherein gain control is effected by reverse biasing converter varactors to reduce capacitance versus voltage sensitivity of the varactors and thus decrease conversion gain. Thereby large signal handling characteristics of the parametric amplifier are enhanced by driving the varactors in a more linear region of their operating characteristics. The system may be employed in an automatic gain control loop of a radio receiver.

BRIEF DESCRIPTION OF THE DRAWINGS

The above and still further objects, features and advantages of the present invention will become apparent upon consideration of the following detailed description of one specific embodiment thereof, especially when taken in conjunction with the accompanying drawing, wherein.

DESCRIPTION OF THE PREFERRED EMBODIMENT

Figure 1:
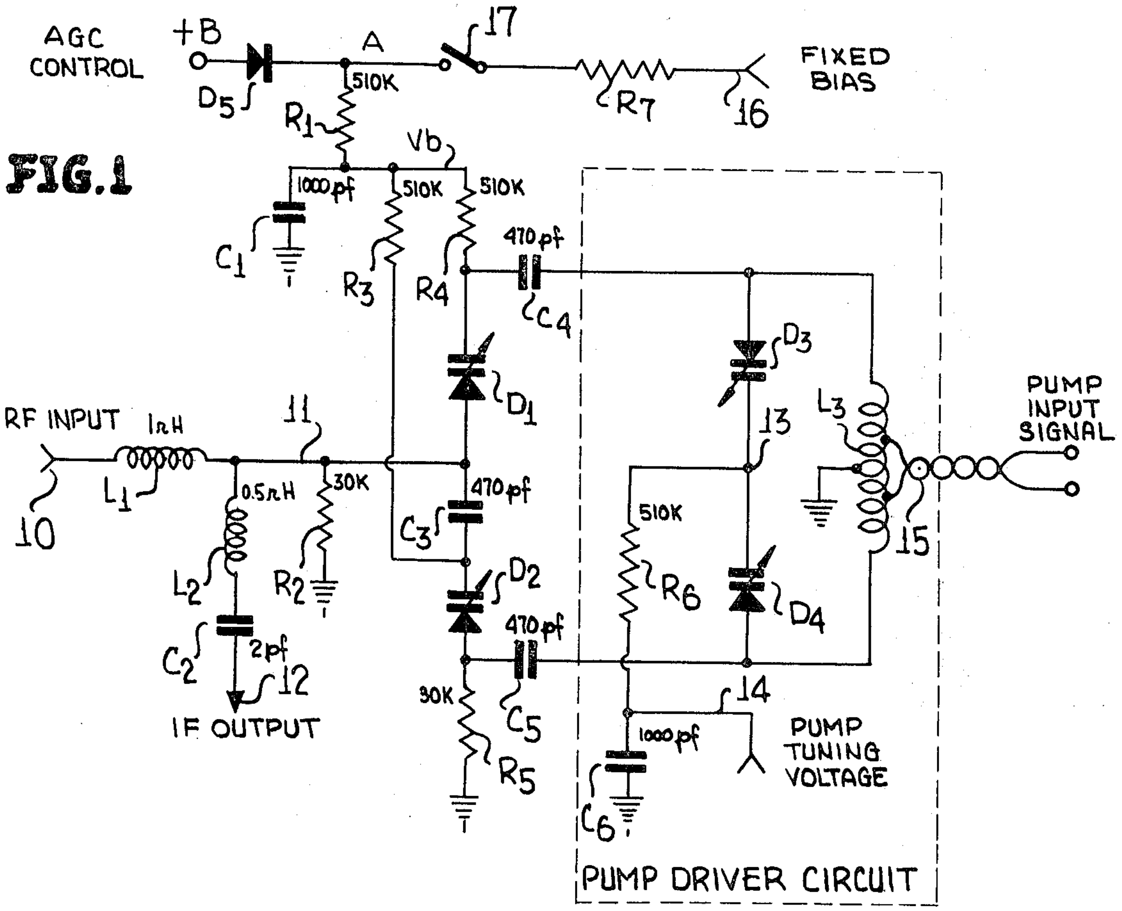
FIG. 1 is a schematic circuit diagram of a parametric amplifier according to the invention.

In FIG. 1, 10 is an R.F. signal input terminal, to which may be applied a signal, for example in the range 0.5 to 30 mHz. A choke coil $L_1$ connected between terminal 10 and lead 11 serves to isolate signal at 160 mHz. from terminal 10. The latter signal is applied to output lead 12 via a series tuned filter comprising inductance $L_2$ and capacitance $C_2$, which provide a nearly zero impedance path for I.F. signal, and a high impedance path for R.F. input signal.

Lead 11 is connected to the junction of varactors $D_1$ and $D_2$. The anode of $D_2$ is connected to ground via resistance $R_5$ and the cathode of $D_1$ to ground via resistance $R_4$ and capacitance $C_1$. The point 11 is connected to the anode of $D_1$ and the cathode of $D_2$ through capacitor $C_3$.

The cathode of $D_1$ is coupled by capacitor $C_4$ to one side of center grounded coil $L_3$, and the anode of $D_2$ to the other side via capacitor $C_5$. Connected across coil $L_3$ is a pair of opposed varactors $D_3$ and $D_4$, having their cathodes connected to a common point 13, which is in turn connected via resistance $R_6$ to a lead 14 to which is supplied pump tuning voltage. $D_3$ and $D_4$ provide tuning capacitance for coil $L_3$, which is driven in push pull by a pump input signal of 159.5–130 mHz. via leads 15.

A source of positive AGC voltage is supplied to terminal B, from a receiver, not illustrated, and thence via diode $D_5$, resistances $R_1$, $R_4$ to the cathode of varactor $D_1$, and via resistances $R_1$ and $R_3$ to the cathode of varactor $D_2$. Capacitor $C_3$ provides D.C. isolation, for gain control voltage, between the cathode of $D_2$ and the anode of $D_1$, and also from point 11.

In lieu of automatic gain control voltage, fixed bias may be applied, which is derivable from lead 16, via resistance $R_7$, and applied at will via switch 17.

In operation, pump input signal is applied at a frequency in the range 159.5–130 mHz., which will convert with the R.F. input signal, in the range 0.5 to 30 mHz., as a sum heterodyne produce to 160 mHz. at lead 12. The pump signal is applied via the resonant circuit consisting of $L_3$, $D_3$, $D_4$, which may be tuned to resonance with the pump frequency by pump tuning voltage applied to lead 14 and thence to the cathodes of $D_3$, $D_4$ to back-bias the latter.

The R.F. input signal applied to lead 10 may have a wide range of amplitudes. The varactors $D_1$ and $D_2$ develop self-bias voltage at point A due to rectification of the pump signal, which provides a quiescent bias level on varactors $D_1$ and $D_2$ equal approximately to the peak value of the pump signal as seen at $D_1$ and $D_2$. This self bias may be superseded by D.C. voltage supplied at lead B, and is not essential to operation of the system.

The value of $V_b$, the bias voltage applied to varactors $D_1$ nd $D_2$ is selected as follows.

For an abrupt junction varactor, as in the case of $D_1$ and $D_2$ $$S=S_0\left(\frac{(V_b+V_0)^{1/2}}{V_0^{1/2}}\right) \tag{1}$$

where $V_0$=diffusion potential ($\approx$0.7 volt)
$s_0$=elastance at $V_b$=0
$s$=elastance under bias $$\frac{ds}{dV_b}=\left(\frac{S_0}{2V_0^{1/2}}\right)\times\frac{1}{(V_b+V_0)^{1/2}} \tag{2}$$

Thus, as $V_b$ is increased, elastance versus voltage sensitivity of the varactors is decreased.

The gain of the converter is a function of elastance swing /ΔS/ of the converter diode about its quiescent value S, due to the action of the pump signal. Gain may be reduced by increasing the quiescent reverse bias, $V_b$, thereby reducing /ΔS/ for any given pump swing, according to Equation 2.

Figure 2:
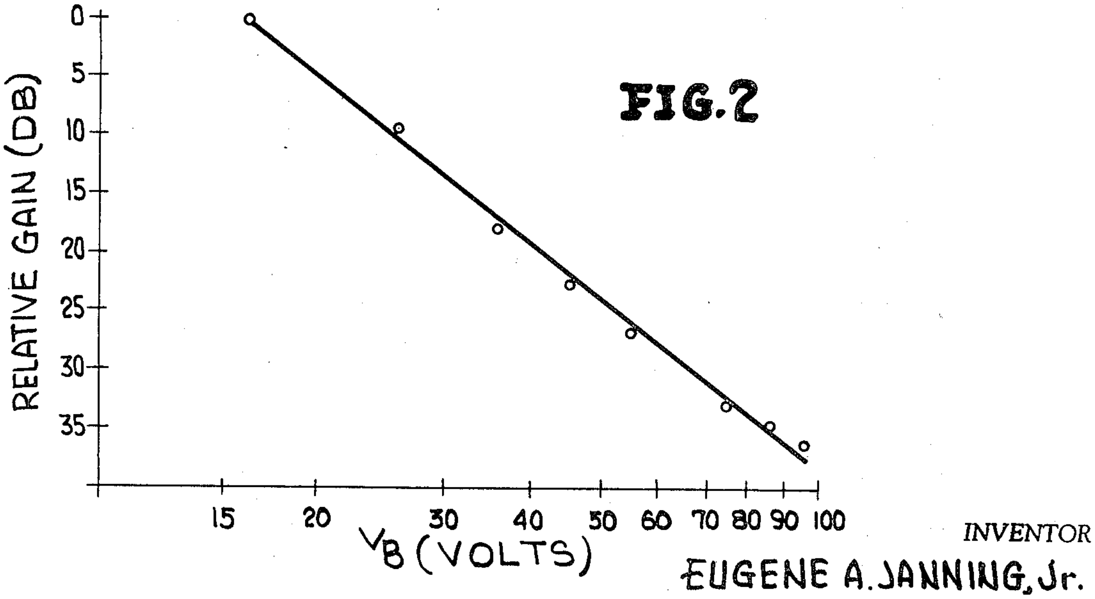
FIG. 2 is a plot of measured attenuation versus control of the system of FIG. 1.

FIG. 2 provides a plot of negative gain versus $V_b$ for the circuit of FIG. 1, whether $V_b$ is derived as a signal derived gain control voltage or is manually adjusted. It is significant that gain is linear as a function of log $V_b$.

The present system, in addition to providing gain control over a wide range, about 35 db, for a reasonable range of control voltage, 15–100 v. enhances large-signal-handling capacity, since as gain is increased the varactors are moved further away from forward bias condition and into a more linear operation region.

Circuit values and varactor types for the exemplary frequencies ranges specified herein are as follows:

$D_1$ and $D_2$—TRW Type PC116G
$D_3$ and $D_4$—Philco V-3289
$L_1$—1 microhenry
$L_2$—0.5 microhenry
$L_3$—50 microhenry
$C_1$, $C_6$—1000 pf.
$C_2$—2 pf.
$C_3$, $C_4$, $C_5$—470 pf.
$R_1$, $R_3$, $R_4$, $R_6$—510 K
$R_2$, $R_5$—30 K Capacitors $C_3$, $C_4$, $C_5$ function essentially for D.C. blocking. $C_1$, $C_6$ function as bypass or A.C. grounding capacitors.

While I have described and illustrated one specific embodiment of my invention, it will be clear that variation of the details of construction which are specifically illustrated and described may be resorted to without departing from the spirit and scope of the invention as defined in the appended claims.

I claim:

1. A balanced parametric amplifier, including:
a first diode varactor,
a second diode varactor connected in series with said first diode varactor,
said first diode varactor having its anode coupled to the cathode of the second diode varactor to provide a single junction directly R.F. coupled to said anode and cathode,
a source of R.F. signal connected by a single lead directly to said junction,
a tuned I.F. output circuit connected by a single lead directly to said junction,
means for applying pump signal in push-pull relation across said first and second varactors taken in series, and means for jointly back biasing said first and second varactors identically and in selective degree by voltages applied to their cathodes to adjust the gain and the large signal handling capabilities of said amplifier simultaneously in the same sense and so that as signal amplitude increases the signal remains on a linear portion of the operating characteristic of the amplifier while the gain of the amplifier decreases.

2. The combination according to claim 1 wherein said means for jointly back biasing includes:
a source of positive bias voltage,
equal resistances connecting said source of positive bias voltage to the cathodes of said first and second diode varactors, respectively, and
equal resistance connections between the anodes of said first and second diode reactors and a point of reference potential.

3. The combination according to claim 1 wherein said means for jointly back biasing is an automatic gain control circuit.

4. A balanced parametric frequency converter, including a source of radio frequency input signal, an input terminal to which said source of radio frequency input signal is connected,
a first diode varactor, having electrodes of first and second types,
a second diode varactor having electrodes of said first and said second type,
means including a coupling capacitor connecting said first and second varactors in series, said first and second varactors being identically poled, said terminal being the junction of one of said varactors with said coupling capacitor, one of said types of electrodes being an anode and the other a capacitive cathode,
means applying identical variable DC bias voltages to said capacitive cathodes to vary the gain and large signal handling capabilities of said converter in the same sense and so that as signal amplitude increases the signal remains on a linear portion of the operating characteristic of the amplifier while the gain of the amplifier decreases,
a tuned intermediate frequency output circuit connected to said terminal, and
means for applying pump signal across said varactors.

5. The combination according to claim 4, wherein said last named means includes a pump signal source for said varactors, said pump signal source including series connected third and fourth varactors coupled via coupling capacitors across said first and second varactors, said third and fourth varactors being poled back-to-back and having each capacitive electrode, said capacitive electrodes being connected together to form junction, a source of adjustable bias voltage connected to the junction of said third and fourth varactors, and a center grounded drive coil connected across said third and fourth varactors, said third and fourth varactors, coil and bias voltage source providing a tunable tank circuit tuned to the pump signal frequency.

References Cited

UNITED STATES PATENTS

| | | | |
|---|---|---|---|
| 3,249,881 | 5/1966 | DeNiet | 330—4.9 |
| 3,264,488 | 8/1966 | McGrogan | 307—88.3 |
| 3,316,421 | 4/1967 | Biard | 307—88.3 |
| 3,388,263 | 6/1968 | Daniel | 307—88.3 |

ROY LAKE, Primary Examiner

D. R. HOSTETTER, Assistant Examiner

U.S. Cl. X.R.

330—4.9, 127